(12) United States Patent
Barringer et al.

(10) Patent No.: US 6,530,805 B1
(45) Date of Patent: Mar. 11, 2003

(54) CONTACT PIN HOLDER ASSEMBLY

(75) Inventors: Dennis R. Barringer, Wallkill, NY (US); Drew R. Horvath, Red Hook, NY (US)

(73) Assignee: International Business Machines Corporation, Armonk, NY (US)

( * ) Notice: Subject to any disclaimer, the term of this patent is extended or adjusted under 35 U.S.C. 154(b) by 454 days.

(21) Appl. No.: 09/119,157

(22) Filed: Jul. 20, 1998

(51) Int. Cl.[7] .............................................. H01R 13/60
(52) U.S. Cl. ...................................... 439/527; 439/532
(58) Field of Search .................. 435/532, 535, 435/536, 537, 538, 539, 716, 717, 395–405, 78, 527

(56) References Cited

U.S. PATENT DOCUMENTS

| | | |
|---|---|---|
| 4,625,164 A | 11/1986 | Golder et al. |
| 4,833,404 A | 5/1989 | Meyer et al. |
| 5,166,605 A | 11/1992 | Daum et al. |
| 5,521,522 A | 5/1996 | Abe et al. |
| 5,552,563 A | 9/1996 | Conder et al. |
| 5,570,032 A | 10/1996 | Atkins et al. |
| 5,595,507 A * | 1/1997 | Braun et al. ................. 439/716 |
| 5,604,476 A | 2/1997 | Schmidt et al. |
| 5,620,346 A | 4/1997 | Okumura |
| 5,625,287 A | 4/1997 | Nakamura et al. |
| 5,647,763 A * | 7/1997 | Arnold et al. ............ 439/540.1 |
| 5,718,593 A * | 2/1998 | Figueiredo et al. ......... 439/76.1 |
| 5,779,504 A * | 7/1998 | Dominiak et al. ........... 439/709 |
| 5,893,776 A * | 4/1999 | Black et al. ................. 439/532 |

* cited by examiner

*Primary Examiner*—Lincoln Donovan
(74) *Attorney, Agent, or Firm*—Steven Capella

(57) ABSTRACT

A contact pin holder designs which enable the provision of more contact points in a test head space while maintaining economical and convenient pin replaceability, precise pin alignment and appropriate electrical environment. The contact pin holder enables these benefits by an improved contact pin holder design which is generally characterized by an engagement structure at the periphery of a opening in a contact support housing which engagement structure releasable engages one or more modules containing one or more contact pins.

17 Claims, 4 Drawing Sheets

CONTACT PIN HOLDER ASSEMBLY

BACKGROUND OF THE INVENTION

Printed circuit boards, integrated circuit wafers and electronic packages and other electronic components are widely used in almost every aspect of the electronics industry. It is important to be able to test the electrical integrity and performance characteristics of these components during manufacture and/or in the field. The ability to perform testing in a facile manner leads to decreased product development time, improved product quality control, and improved technical (diagnostic) service in the field.

The ability to adequately test various boards, wafers and packages in a fast, economical and reliable manner becomes more challenging with the ever increasing density of devices contained on these electronic components. Additional challenges may also be presented where the size (e.g., device-occupied surface area) of these electrical components is also increasing. In meeting these testing challenges, it is naturally desirable to minimize the capital outlay for new test equipment. It is highly desirable to adapt current testing equipment to the testing of more complex electronic components. The ability to adapt testing equipment can result in the ability to avoid or postpone capital investment in testing equipment while still meeting the testing objectives.

Most electronic testing equipment contains two primary functions, namely (1) an electronics section for performing testing protocols and/or reporting test results and (2) an interface between the testing equipment electronics and the electronic component or device under test (DUT). The electronics section of the test equipment used to perform the DUT testing is often fairly adaptable to the increased electrical testing complexity.

While the testing power of electronics section may be adequate or easily adaptable, the ability to efficiently interface the testing electronics with the actual DUT to be tested may present a challenge. The interface in most testing equipment involves the use of a test head. The test head typically engages the DUT. Contacts (pins) in the test head are brought into electrical contact with locations on the DUT. Thus, the test head typically contains a plurality of contacts as well as means for engaging the DUT and establishing physical contact (of sufficient electrical conductivity) between locations on the DUT and the test head contacts. The established electrical connections in turn can be used by the electronics section of the testing equipment to perform the desired testing.

The ability of the electronics section to perform testing efficiently may be held back by the number of contacts that the test head can simultaneously establish with the DUT. Thus, the ability to increase the number of contacts is often desirable from the point of improved testing efficiency. The desire to increase the number of simultaneous contacts generally increases with the complexity of the DUT to be tested. While more contact points are desired, the physical space occupied by the test head and DUT is often fixed by the physical configuration of the overall testing equipment.

The limitation on the physical space available for contact pins and the desire to house more contact pins in the test head leads to a desire to place contact pins in a more dense configuration. Increased pin density often leads to difficulty in the ability to replace worn out or defective contact pins on an economical and convenient basis. For example, if screws are used to fix the pins in place, those screws may have to be reduced in size to accommodate more pins. Smaller screws (or other fasteners) generally have increased incidence of mishandling leading to poorly fastened or unattached screws which may damage the test head or the device under test.

In addition to replaceability, increased pin density places challenges on the ability to maintain desired contact pin configurations in the test head as well as the appropriate/desired electrical environment for the pins. For example, where coaxial pogo pins are used, there is often a desire to commonly ground the sheath conductors for each pin while avoiding the grounding of the pins to other components of the test head.

Thus, there is a demand for contact pin holder designs which improve the usage of physical space occupied by the test head whereby more contacts can be simultaneously made in the same test head space while maintaining economical and convenient pin replaceability, precise pin alignment and appropriate electrical environment. These demands are especially apparent in the context of existing auto handler and manual DUT board testing equipment as well as in the area of wafer-level testing and bum-in using wafer prober apparatus which typically involves the interfacing of probe cards and wafers (or other device under test) with various contact structures.

SUMMARY OF THE INVENTION

The invention provides contact pin holder assemblies which enable the provision of more contact points in a test head space while maintaining economical and convenient pin replaceability, precise pin alignment and appropriate electrical environment. The invention enables these benefits by an improved contact pin holder assembly design which is generally characterized by an engagement structure at the periphery of a opening in a contact support housing which engagement structure releasably engages one or more modules containing one or more contact pins.

In one aspect, the invention encompasses a contact pin holder assembly for holding contact pins in an opening of a contact pin support housing, the assembly comprising:

(a) a first rail attached to the support housing about at least a portion of the opening, the first rail containing a rail coupling means for releasably engaging coupling means from one or more pin-containing modules, (b) means for attaching the rail to the support housing, (c) at least one contact pin-containing module, the module having a first module coupling means for releasably engaging the rail coupling means, whereby engagement of the rail coupling means and module coupling means causes the module to become releasably fixed in position relative to the contact pin support housing.

The assembly preferably comprises a plurality of rails fixed about the opening in the support housing. The rails preferably contain a plurality of coupling means whereby a plurality of pin-containing modules can be releasably secured to the rail. Preferably, each module is releasably secured through at least two rail coupling means, more preferably couplings on separate rails which face each other in a substantially parallel relationship. The coupling means of the rail and/or module preferably include at least one spring element which can be reversibly deflected.

The invention further encompasses testing apparatus and methods using the contact pin assembly of the invention. The invention is especially useful in the context of manual test, auto handler and wafer prober testing equipment.

These and other aspects of the invention are described in further detail below.

DETAILED DESCRIPTION OF THE INVENTION

The invention provides contact pin holder assemblies which enable the provision of more contact points in a test head space while maintaining economical and convenient pin replaceability, precise pin alignment and appropriate electrical environment. The invention enables these benefits by an improved contact pin holder assembly design which is generally characterized by an engagement structure at the periphery of a opening in a contact support housing which engagement structure releasably engages one or more modules containing one or more contact pins.

The contact pin holder assembly of the invention provides the ability to hold contact pins in an opening of a contact pin support housing. The assembly preferably includes:

(a) a first rail attached to the support housing about at least a portion of the opening, the first rail containing a rail coupling means for releasably engaging module coupling means from one or more pin-containing modules, (b) means for attaching the rail to the support housing, (c) at least one contact pin-containing module, the module having a first module coupling means for releasably engaging the rail coupling means, whereby engagement of the rail coupling means and module coupling means causes the module to become releasably fixed in position relative to the contact pin support housing.

Figure 1:
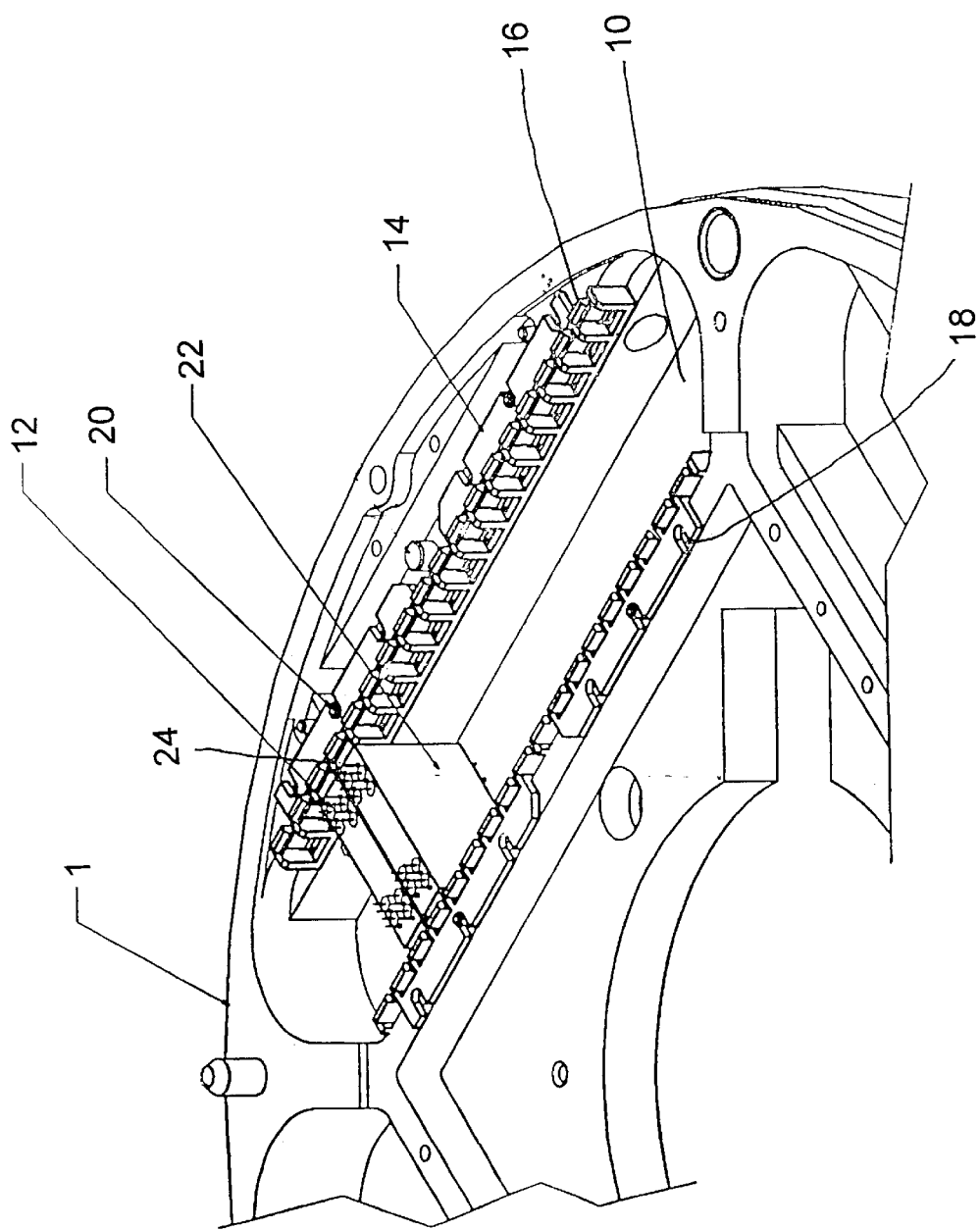
FIG. 1 is a perspective view of a pogo pin support housing with a contact pin holder assembly according to the invention.

The support pin housing may be any housing suitable for containing contact pins. Preferably, the housing is suitable for use in a test head. An example of a test head support pin housing is shown in FIG. 1 which shows housing 1 for use in a test head. Housing 1 preferably contains one or more openings 10 for holding contact pins 12. The size and shape of the openings may vary depending on the geometry of the test head, the number of contact pins to be loaded and the desired overall configuration of the contact pins in the test head or other device in which the pins are to be used.

First and second rails 14 are attached to the periphery of opening 10. Preferably, rails 14 cover periphery of opening 10 such that portions of rails 14 are at least orthogonal to each other, more preferably parallel with each other such that rail coupling means 16 face each other on opposite sides of opening 10. If desired, a single annular rail or ring may be used. Alternatively, plural rails may be used on a single side. Rails 14 are preferably formed in precise shapes which allow for the precise positioning of the contact pins in the test head. The rails preferably have receptacles or openings 18 where screws 20 or other fixing means can be used to fix the rails relative to the support housing opening. Other fastening means such as spring clips may be used to hold the rails in place depending on the configuration of the housing (e.g. space to accommodate the fixing means). The rails are preferably made of an electrically insulating material whereby the contact pin modules 22 can be electrically isolated from housing 1. Preferably, the rails are formed from an organic resin material such as a resin which is amenable to injection molding or other suitable forming technique. Preferred materials are organic resins comprise polycarbonates. Where increased flexibility is desired, minor amounts of other resins may be added (e.g. thermoplastic resin or elastomers). The rails should be of sufficient strength to allow the rails to be reliably fixed to the housing and to withstand stresses associated with the pressure used to form a suitable electrical contact between the contact pins and a board or device. The rails should also be of suitable stiffness such that the contact stresses do not result in undesired deflection of the rails.

The rails preferably contain at least one and more preferably a plurality of rail coupling means 16. The number and spacing of the rail coupling means may be varied depending on the number and size of the pin modules 22 to be housed. The rail coupling means are preferably spaced such that pin modules 22 can be installed in direct contact with each other to facilitate common grounding of the pin modules 22. Preferably, the rail coupling means 16 on opposing rails 14 are aligned whereby module coupling means 24 on opposite sides of pin modules 22 can engage respective rail coupling means 16 on opposing rails 14 (or opposing sections of a single annular rail).

The invention is not limited to any specific rail coupling means. Preferably, the rail coupling means is capable of engaging the module coupling means to releasably couple the contact pin module to the rail while maintaining electrical isolation of the module from the support housing. Additionally, the rail coupling means preferably functions with the module coupling means to maintain the module in a desired spatial alignment relative to the rails and the support housing upon application of pressure to contact pins contained in housing as well as upon exposure to gravitational or inertial forces associated with handling/orientation of the housing or test head. Preferably, the rail coupling means avoids the use of elements which must be loosened or detached from the rail in order to remove the contact pin module.

The rail coupling means preferably contains one or more spring elements that can be actuated or deflected by contact with the module coupling means or by mechanical intervening action (manual or automated). The spring element may be a single deflectable arm with one or more protrusions, openings or spaces to secure a component of the module coupling means coming into the rail coupling means. Alternatively, a combination of laterally deflectable spring arms with protrusions, openings or spaces may be used to secure a component of the module coupling means coming into the rail coupling means. Where space permits, the spring element may be spring-loaded deflectable protrusion in a socket in the rail. Such a protrusion would act in combination with a guide element in the rail coupling means where a component of the module coupling component is engaged by the protrusion in the opening defined by the protrusion and guide element.

Figure 2:
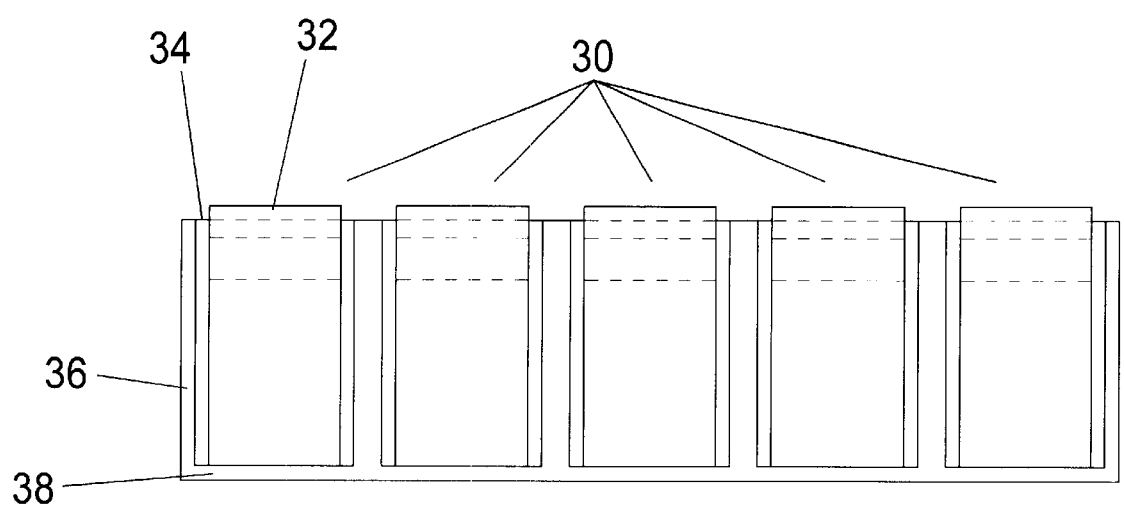
FIG. 2 is a schematic front view of rail and rail coupling means according to the invention.
Figure 3A:
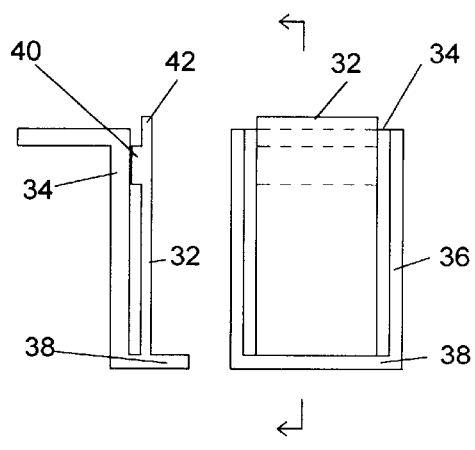
FIGS. 3A–3D are schematic side cross section and front views of four different rail coupling configurations according to the invention.

Examples of possible coupling means configurations are shown in FIG. 24. In FIG. 2, a series of rail coupling means 30 are shown where spring arms 32 are deflectable away from rail 34. Rail 34 preferably includes outwardly extending ridges 36 and 38 which are adapted to strengthen and stabilize the rail and rail coupling means as well as to maintain the proper alignment of pin modules which may be brought into the opening of the support housing. Spring arm 32 contains a protrusion 40 facing toward rail 34. FIG. 3A shows spring arm 32 in its rest position. Arm 32 may be deflected by forcing an element of the module coupling means between the rail and spring arm 32. The coupling means would have an opening adapted to engage the protrusion allowing the deflected spring arm to relax into a position locking the module into the rail. Preferably the spring arm includes a portion 42 which extends above the rest of the rail to enable deflection of spring arm 32 by application of force against portion 42. In this way, the spring arm may be deflected to release the pin module thereby allowing the module to be easily replaced.

Figure 3B:
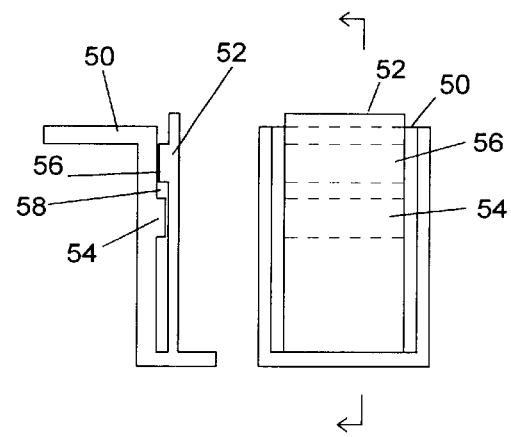
Figure 3C:
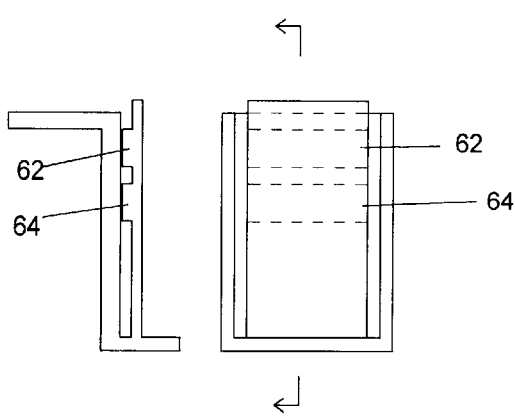
Figure 3D:
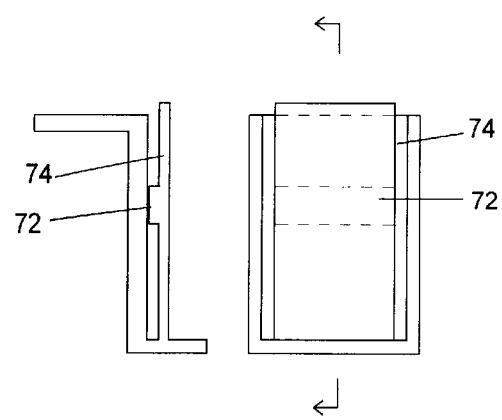

FIGS. 3B–3C disclose some alternative rail coupling means. In FIG. 3B, the rail 50 and the spring arm 52 contain protrusions 54 and 56. The coupling means may contain an element adapted to reside in space 58 defined by the protrusions or may contain elements adapted to surround the protrusions. The protrusions 62 and 64 in FIG. 3C function in a similar manner as those of FIG. 3B. FIG. 3D shows an alternative configuration with a lower placement of the protrusion 72 which enables increased locking strength since greater spring arm 74 must be deflected to a greater extent for engagement and release of the component of the module coupling means.

Figure 4A:
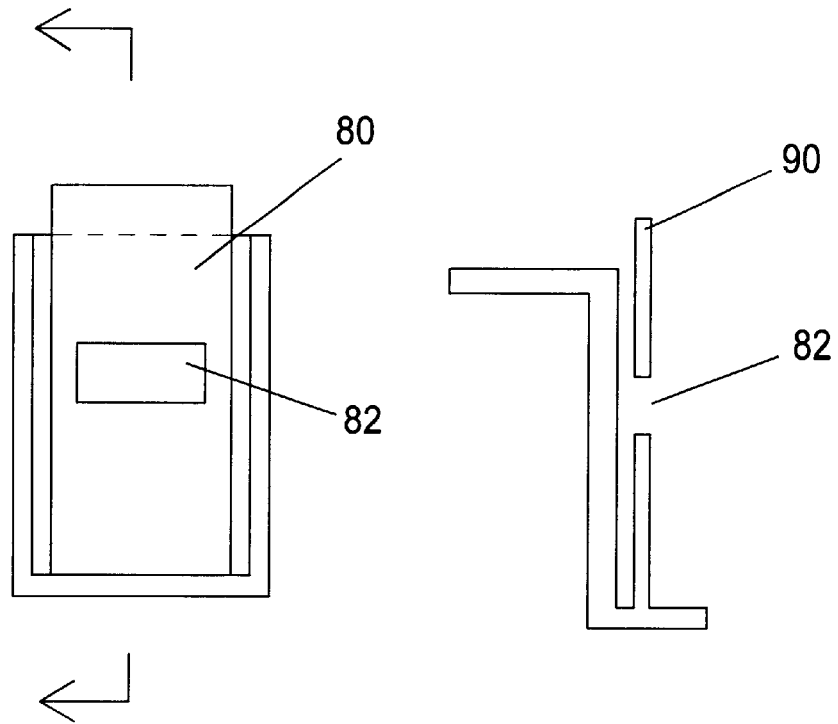
FIG. 4A is schematic a side cross section and front view of a rail coupling means according to the invention including an opening in a spring arm member.
Figure 4B:
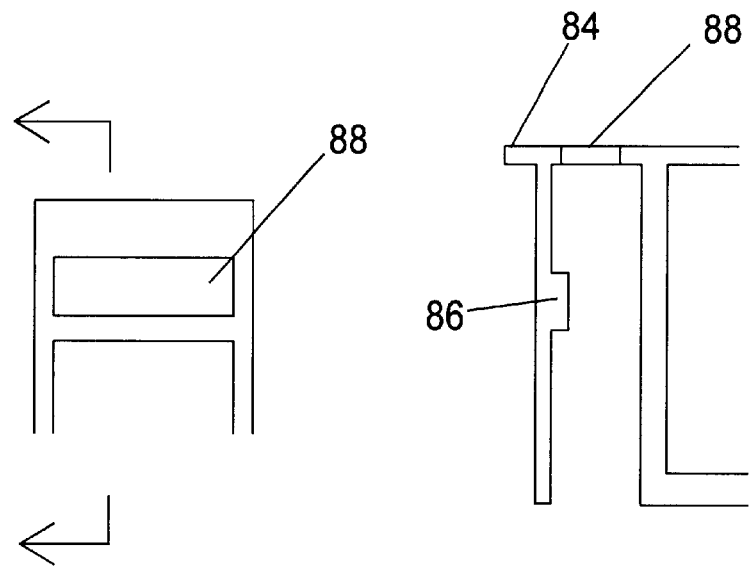
FIG. 4B is schematic a side cross section and plan view of a module coupling means according to the invention adapted to engage the rail coupling means of FIG. 4A.

FIG. 4 shows a further alternative configuration where spring arm 80 actually contains an opening 82. Coupling means 84 contains a corresponding protrusion 86 adapted to engage opening 82 whereby the module locked into the rail. The module coupling means in this instance contains an opening 88 for passage of upper portion 90 of spring arm 80 there through. Opening 88 is preferably sufficiently wide to permit application of force against arm portion 90 whereby the pin module can be easily disengaged from the rail.

The pin modules used in the invention are preferably capable of housing a plurality of pins. The walls of the modules are preferably formed of an electrically conductive material to facilitate common grounding of coaxial pins in the module and across adjacent modules. The dimensions of the module preferably enable the module to span the opening in the support housing and to enable compact placement of adjacent modules. Each pin module preferably contains at least to module coupling means located at opposite ends of the module. The module coupling means preferably contains a component adapted to engage an opening or protrusion in a corresponding rail coupling means. Thus, the designs for the rail coupling means and module coupling means should be selected to ensure proper engagement of the module to the rail.

While the invention is not limited to any specific module coupling means, the module coupling means preferably includes a tongue or other member extending from the end of module. The extending member preferably has one or more openings or protrusions to mate with corresponding protrusions or openings in the rail coupling means. As noted above, the extending member may have an additional opening to enable positioning of an arm of the rail coupling means through the extending member with sufficient space for the arm to be deflected to disengage the coupling means.

The module coupling means and rail coupling means are preferably selected such that their engagement automatically results in the proper alignment of the pin module in the support housing. In some instances, further elements may be provided to ensure alignment of the modules and/or reduce stress on the couplings. The extending ridges 36 and 38 shown in FIG. 2 may provide this benefit.

The invention further encompasses testing apparatus and methods using the contact pin assembly of the invention. The invention is especially useful in the context of manual test, auto (automatic) handler and wafer prober testing equipment. The contact pin modules preferably contain pogo pins, however other contact pins may also be employed if desired. Where the contact pins are coaxial, preferably one conductor (typically sheath) of each pin is biased to a common ground potential. This common ground potential is preferably carried between adjacent pin modules through the electrically conductive module walls. In the methods of the invention, the modules containing the desired contact pins are engaged in the rails by application of mechanical force to the rail coupling means as the module coupling means is brought into a coupling position. All the modules in the opening are preferably in close contact to enable the easy establishment of a common ground voltage between the modules. The assemblies of the invention are especially suitable for use in test heads where high contact pin count and contact pin density is desired. Preferably, test heads using the contact pin assemblies of the invention are configured to contain at least 500 contact pins, more preferably at least 1000 contact pins in the test head.

Once the desired pin configuration is achieved, the test head may be used in an appropriate testing apparatus using any desired testing protocol. Contact pin modules may be removed/replaced by exerting mechanical force to disengage the module coupling means from the rail coupling means. This process may be performed manually or may be automated. Thus, the invention enables easy replacement of faulty or worn out contacts as well as easy reconfiguration of the contact pin arrangement in the test head.

What is claimed is:

1. A contact pin assembly for holding contact pins in an opening of a contact pin support housing, said assembly comprising:
    (a) a first rail attached to a support member of said support housing about at least a portion of said opening, said first rail containing a rail coupling means for releasably engaging coupling means from a plurality of one pin-containing modules,
    (b) means for attaching said rail to said support member,
    (c) a plurality of contact pin-containing modules, said modules each having a first module coupling means for releasably engaging said rail coupling means, whereby engagement of said rail coupling means and respective module coupling means causes said modules respectively to become releasably fixed in position relative to said contact pin support housing, said assembly holding said contact pins in an exposed position for contacting a circuit board or wafer.

2. The contact pin assembly of claim 1 further comprising a second rail attached to said support housing about a further portion of said opening opposite said first rail, said second rail having a rail coupling means for releasably engaging coupling means from one or more of said pin-containing modules.

3. The contact pin assembly of claim 2 wherein each of said modules has a second coupling means on a side of said module opposite the location of said first module coupling means.

4. The contact pin assembly of claim 3 wherein said first and second rails are spaced apart from each other by a distance where by said plurality of modules are positioned in said opening between said rails and said first and second coupling means of each of said modules respectively engaging said rail coupling means of said first and second rails.

5. The contact pin assembly of claim 1 wherein said rails are made of an electrically insulating material.

6. The contact pin assembly of claim 5 wherein said electrically insulating material comprises an organic resin.

7. The contact pin assembly of claim 1 wherein said modules each comprise at least one wall made of an electrically conductive material.

8. The contact pin assembly of claim 7 containing means to bias the electrical potential of the electrically conductive walls of said modules to a common ground potential.

9. The contact pin assembly of claim 8 wherein each module comprises means to bias the electrical potential of an electrically conductive portion of at least one contact pin contained in each of said modules to said common ground potential.

10. The contact pin assembly of claim 1 wherein said rail coupling means comprises a plurality of reversibly deflectable spring members attached to said rail with a protrusion on a distal portion of each respective spring member, said spring members being reversibly deflectable relative to said rail to thereby create respective openings for entrance of a portion of a respective module coupling means, each spring member having an untensioned position corresponding to a narrowing or closing of said respective opening, each opening defining a direction for installation and removal of a respective module.

11. The contact pin assembly of claim 1 wherein said rail further comprises an alignment means for mating with a portion of module coupling means of each of said modules when said module coupling means are engaged with said rail coupling means, said alignment means and respective module coupling means acting to releasably fix said respective modules in space relative to said rail upon said engagement.

12. The contact pin assembly of claim 1 wherein said rail coupling means comprises a plurality of reversibly deflectable spring members attached to said rail with a space in each of said spring members adapted to receive a portion of a respective module coupling means, each spring member being reversibly deflectable relative to said rail to thereby create an opening for entrance of said portion of said respective module coupling means, each spring member having an untensioned position corresponding to a narrowing or closing of said opening, each opening defining a direction for installation and removal of a respective module.

13. The contact pin assembly of claim 1 wherein said rail coupling means comprises a plurality of pairs of reversibly deflectable spring arms attached to said rail, each pair of arms defining a space between said pair of arms adapted to receive a portion of a respective module coupling means, each pair of said spring arms being reversibly deflectable parallel to said rail to thereby create an opening for entrance of a portion of a respective module coupling means, each pair of said spring arms having an untensioned position corresponding to a narrowing or closing of said opening, each opening defining a direction for installation and removal of a respective module.

14. The contact pin assembly of claim 1 wherein said rail coupling means comprises a plurality of reversibly deflectable protrusions from said rail and a guide member attached to said rail, each protrusion being capable of fitting in a first space defined in a portion of said a respective module coupling means upon insertion of said portion into a second space defined by said rail and said guide arm, each protrusion being reversibly deflectable perpendicular to said rail to thereby create an opening for entrance of a portion of a respective module coupling means, each protrusion having an untensioned position corresponding to a narrowing or closing of said opening, each opening defining a direction for installation and removal of a respective module.

15. The contact pin assembly of claim 1 wherein at least one of said rail coupling means or said module coupling means includes a spring element.

16. The contact pin assembly of claim 1 wherein the each module comprises a plurality of contact pins.

17. The contact pin assembly of claim 16 wherein said contact pins are pogo pins.

\* \* \* \* \*